United States Patent
Abe et al.

(10) Patent No.: US 10,139,761 B2
(45) Date of Patent: Nov. 27, 2018

(54) PHOTO INTERRUPTER UNIT, SHEET CONVEYANCE APPARATUS AND IMAGE FORMING APPARATUS

(71) Applicant: CANON KABUSHIKI KAISHA, Tokyo (JP)

(72) Inventors: Hideto Abe, Toride (JP); Koki Watanabe, Moriya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/683,926

(22) Filed: Aug. 23, 2017

(65) Prior Publication Data

US 2018/0059601 A1 Mar. 1, 2018

(30) Foreign Application Priority Data

Aug. 30, 2016 (JP) .................. 2016-168562

(51) Int. Cl.
| | |
|---|---|
| G03G 21/16 | (2006.01) |
| G03G 15/00 | (2006.01) |
| H05K 7/12 | (2006.01) |

(52) U.S. Cl.
CPC ............ G03G 15/50 (2013.01); G03G 21/16 (2013.01); G03G 21/1647 (2013.01); H05K 7/12 (2013.01); *G03G 15/5029* (2013.01); *G03G 21/1695* (2013.01); *G03G 2215/00721* (2013.01); *G03G 2221/1606* (2013.01)

(58) Field of Classification Search
CPC ..... G03G 21/1695; G03G 2215/00616; G03G 2215/00628
See application file for complete search history.

(56) References Cited

U.S. PATENT DOCUMENTS

| | | | |
|---|---|---|---|
| 2006/0065818 A1 | 3/2006 | Shimokawa et al. | |
| 2014/0147183 A1* | 5/2014 | Koshida | B65H 29/52 399/388 |

FOREIGN PATENT DOCUMENTS

| | | |
|---|---|---|
| JP | H03-097947 U | 10/1991 |
| JP | H08-133527 A | 5/1996 |

(Continued)

OTHER PUBLICATIONS

Izumi (JP 2009-066077 A), Apr. 2009, JPO Computer Translation.*
European Search Report issued in corresponding European Application No. 17185226.2 dated Jan. 17, 2018.

*Primary Examiner* — Erika J Villaluna
(74) *Attorney, Agent, or Firm* — Fitzpatrick, Cella, Harper & Scinto

(57) ABSTRACT

A photo interrupter unit includes a photo interrupter and a supporting portion configured to support the photo interrupter detachably. The photo interrupter includes a light emitting portion configured to emit light, a photo sensing portion configured to receive the light emitted from the light emitting portion, and a claw portion configured to be elastically deformable. The supporting portion includes a mounting surface on which the photo interrupter is mounted, a hole portion defining a hole into which the claw portion is inserted, provided in the mounting surface and configured to engage with the claw portion, and a projection projecting from the mounting surface, and configured to regulate a position of the photo interrupter in a deforming direction in which the claw portion is elastically deformable in a state where the claw portion and the hole portion are engaged.

14 Claims, 14 Drawing Sheets

(56) References Cited

FOREIGN PATENT DOCUMENTS

| JP | 2009-066077 A | 4/2009 |
|----|---------------|--------|
| JP | 05549878 B2 | 7/2014 |

\* cited by examiner

PHOTO INTERRUPTER UNIT, SHEET CONVEYANCE APPARATUS AND IMAGE FORMING APPARATUS

BACKGROUND OF THE INVENTION

Field of the Invention

The present invention relates to a photo interrupter unit including a photo interrupter, a sheet conveyance apparatus, and an image forming apparatus comprising the same.

Description of the Related Art

In general, a photo interrupter provided on a slot machine, a camera, a printer and the like is known to detect presence of a detection target object by switching between a state in which light irradiated from a light emitting portion reaches a photo sensing portion and a state in which light does not reach the photo sensing portion. One example of a photo interrupter disposed on a printer is a photo interrupter in which light irradiated from the light emitting portion to the photo sensing portion is blocked by a flag that moves when pressed by a sheet being conveyed to detect the presence of a sheet. The photo interrupter is fixed by a so-called snap fit structure in which an elastically deformable claw portion is fit into a locking hole.

During a mass-production step of performing fitting operation of the snap fit structure, if an operator unintentionally applies an external force to an already correctly-locked photo interrupter, a locking failure may occur in which the snap fit is disengaged or is half-locked. If the locking failure is discovered after the assembling of related components has been completed, the unit including the photo interrupter must be discarded as a defective product or the unit must be disassembled and then reassembled resulting in a loss or deterioration a large amount of of productivity.

Hitherto, as disclosed in Japanese Unexamined Patent Application Publication No. 2009-66077, a photo interrupter unit has been proposed in which a fall-preventing cover 90 is provided in addition to a photo interrupter 70 and a sensor support member 80, as illustrated in FIG. 14A. The operator mounts the photo interrupter 70 to the sensor support member 80, and thereafter, as illustrated in FIG. 14B, locks a connecting piece 96 of the fall-preventing cover 90 to a locking claw 82 of the sensor support member 80, by which the fall-preventing cover 90 is mounted to the sensor support member 80. The fall-preventing cover 90 prevents the photo interrupter 70 from dropping from the sensor support member even if external force is applied to the photo interrupter unit.

The photo interrupter unit disclosed in the above-mentioned Japanese Unexamined Patent Application Publication No. 2009-66077 has a drawback in that both size and cost of the apparatus are increased by providing the fall-preventing cover. Further, the additional step of assembling the fall-preventing cover deteriorates productivity.

SUMMARY OF THE INVENTION

According to the one aspect of the present invention, a photo interrupter unit includes a photo interrupter and a supporting portion configured to support the photo interrupter detachably. The photo interrupter includes a light emitting portion configured to emit light, a photo sensing portion configured to receive the light emitted from the light emitting portion, and a claw portion configured to be elastically deformable. The supporting portion includes a mounting surface on which the photo interrupter is mounted, a hole portion defining a hole into which the claw portion is inserted, provided in the mounting surface and configured to engage with the claw portion, and a projection projecting from the mounting surface, and configured to regulate a position of the photo interrupter in a deforming direction in which the claw portion is elastically deformable in a state where the claw portion and the hole portion are engaged.

Further features of the present invention will become apparent from the following description of exemplary embodiments with reference to the attached drawings.

DESCRIPTION OF THE EMBODIMENTS

First Embodiment

Entire Configuration

Figure 1:
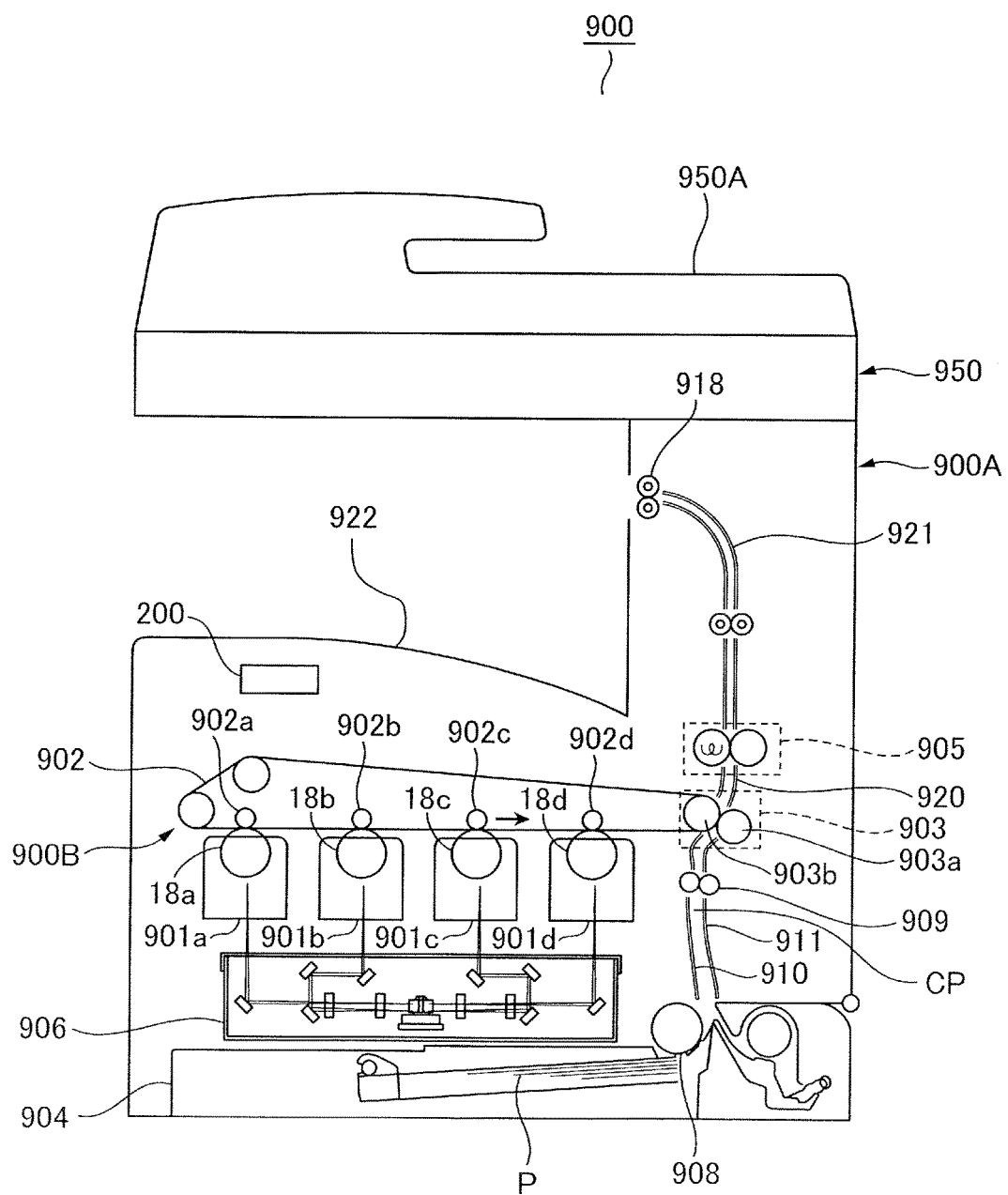
FIG. 1 is a schematic diagram illustrating a printer according to a first embodiment.

Now, a first embodiment of the present invention will be described. FIG. 1 is a schematic diagram illustrating a configuration of a printer adopting an electro-photographic system according to the first embodiment. As illustrated in FIG. 1, a printer 900, serving as an image forming apparatus, comprises, as illustrated in FIG. 1, a printer body (hereinafter referred to as apparatus body) 900A having an image forming portion 900B configured to form an image on a sheet, and an image reading apparatus 950 having a document conveyance apparatus 950A.

Now, the image forming portion 900B includes photosensitive drums 18a through 18d configured to form toner images of four colors, which are yellow, magenta, cyan and black, and an exposing unit 906 configured to radiate laser beams based on image information to form an electrostatic latent image on the photosensitive drum. The photosensitive drums 18a through 18d are driven by a motor not shown, and in the circumference of the drums, a primary charging device (not shown), a developing unit (not shown) and a transfer charging device (not shown) are respectively arranged and formed into units as process cartridges 901a through 901d.

Further, the image forming portion 900B includes an intermediate transfer belt 902 driven to rotate in the direction of the arrow in the drawing, and a secondary transfer portion 903 configured to transfer a full color image sequentially formed on the intermediate transfer belt 902 to a sheet P. Then, a transfer bias is applied from the transfer charging devices 902a through 902d to the intermediate transfer belt 902, and the toner images of respective colors on the photosensitive drum are sequentially transferred in multilayers to the intermediate transfer belt 902. Thereby, a full color image is formed on the intermediate transfer belt 902.

The secondary transfer portion 903 is composed of a secondary transfer counter roller 903b configured to support the intermediate transfer belt 902, and a secondary transfer roller 903a abutted against the secondary transfer counter roller 903b via the intermediate transfer belt 902. Further, a sheet feed cassette 904 is arranged below the image forming portion 900B, and sheets P supported on the sheet feed cassette 904 are fed by a pickup roller 908 serving as a conveyance portion. A registration roller 909 is disposed downstream of the pickup roller 908 in a conveyance direction. A control unit 200 is provided on the apparatus body 900A.

Next, an image forming operation of the printer 900 configured in the above manner will be described. When the image forming operation is started, the exposing unit 906 radiates laser beams based on image information transmitted from a personal computer (not shown) or the like and the photosensitive drums 18a through 18d, whose surfaces are charged uniformly, are sequentially exposed, by which electrostatic latent images are formed on the photosensitive drums 18a through 18d. Thereafter, the electrostatic latent images are developed by toner and visualized.

For example, a laser beam based on an image signal corresponding to a yellow component color of the document is radiated via a polygon mirror of the exposing unit 906, and a yellow electrostatic latent image is formed on the photosensitive drum 18a. Then, the yellow electrostatic latent image is developed using yellow toner from the developing unit, and visualized as a yellow toner image. Thereafter, along with the rotation of the photosensitive drum 18a, the toner image reaches a primary transfer portion where the photosensitive drum 18a and the intermediate transfer belt 902 abut against one another. In a state where the toner image reaches the primary transfer portion, the yellow toner image on the photosensitive drum 18a is transferred to the intermediate transfer belt 902 by a primary transfer bias applied to a transfer charging device 902a.

Next, magenta, cyan and black toner images formed on the photosensitive drums 18b through 18d are transferred onto the yellow toner image borne on the intermediate transfer belt 902 by a similar method as described above. Thereby, a full-color toner image is formed on the intermediate transfer belt 902.

Simultaneously with the toner image forming operation, the sheet P stored in the sheet feed cassette 904 is sent out one at a time by the pickup roller 908. The sheet P is passed between conveyance guides 910 and 911 and reaches the registration roller 909, where a skew of the sheet P is corrected by the registration roller 909, and the sheet P is conveyed to the secondary transfer portion 903. Thereafter, in the secondary transfer portion 903, the four-color toner images on the intermediate transfer belt 902 are collectively transferred onto the sheet P by a secondary transfer bias applied to the secondary transfer roller 903a.

Next, the sheet P, to which the toner image has been transferred, is guided from the secondary transfer portion 903 to a conveyance guide 920 and conveyed to a fixing portion 905 as the sheet passes the fixing portion 905, heat and pressure is applied and the toner image is fixed. Thereafter, the sheet P, to which the toner image has been fixed, passes a sheet discharge conveyance guide 921 arranged downstream in the conveyance direction of the fixing portion 905, and the sheet P is discharged via a sheet discharge roller pair 918 to a sheet discharge tray 922.

Photo Interrupter and Flag Unit

Figure 2A:
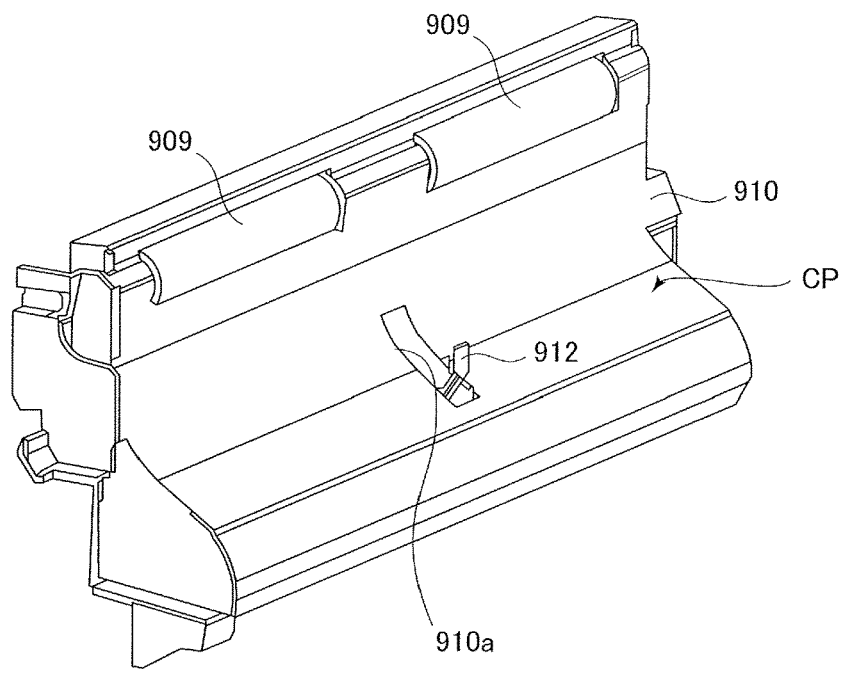
FIG. 2A is a perspective view illustrating a conveyance guide and a sensor flag.
Figure 2B:
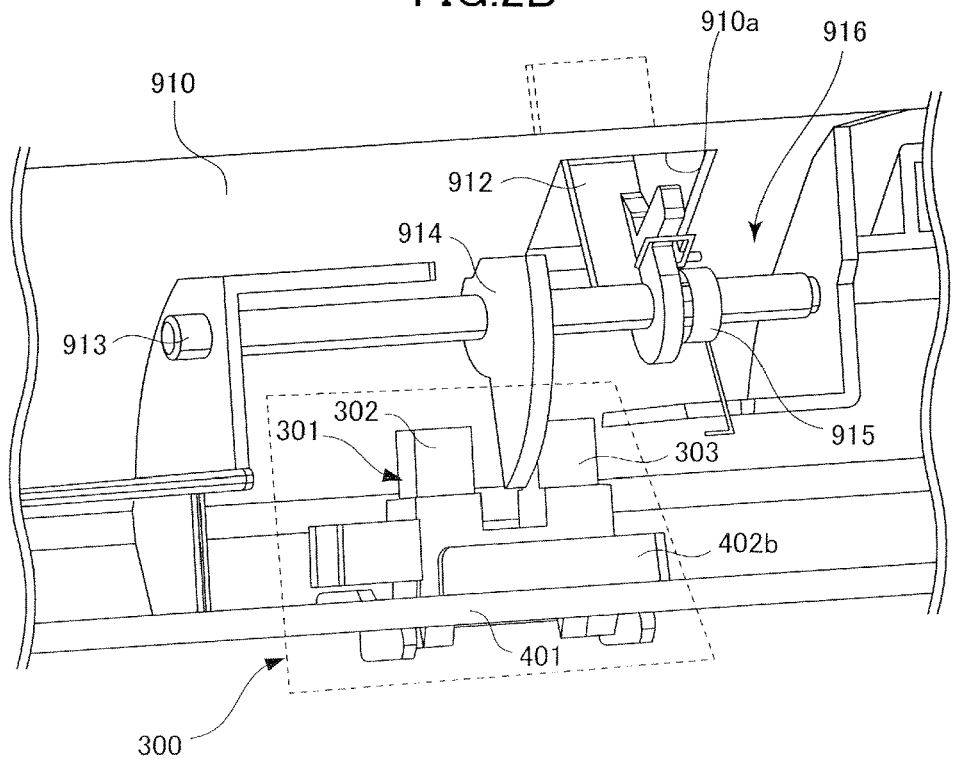
FIG. 2B is a perspective view illustrating the sensor flag from a rear side.

FIG. 2A is a perspective view illustrating a conveyance guide 910, the registration roller 909 and a pressing portion 912. For sake of description, the opposing registration roller and other components are not shown. FIG. 2B is a view illustrating a flag unit 916 from a rear side.

As illustrated in FIG. 2B, a mounting portion 401, serving as a supporting portion, is formed integrally with the conveyance guide 910, and a photo interrupter 301 is removably mounted to the mounting portion 401. The photo interrupter 301 includes a light emitting portion 302, having a light emitting element arranged on an interior thereof, and a photo sensing portion 303, retaining a light receiving element in an interior thereof.

Further, the flag unit 916 serving as a moving portion is mounted to the conveyance guide 910. The flag unit 916 includes a pivot shaft 913 pivotably supported on the conveyance guide 910, and a pressing portion 912 and a flag portion 914 respectively uniformly fixed to the pivot shaft 913. The pressing portion 912 is projected through a long hole 910a formed on the conveyance guide 910 to a conveyance path CP defined by the conveyance guides 910 and 911 (refer to FIG. 1). The flag portion 914 is configured to enter between the light emitting portion 302 and the photo sensing portion 303, and blocks light emitted from the light emitting portion 302. The flag unit 916 is urged by a torsion spring 915 mounted on the pivot shaft 913 such that the pressing portion 912 is projected to the conveyance path CP and such that the flag portion 914 is arranged at a rotation angle that does not block light emitted from the light emitting portion 302. In other words, in a state where there is no sheet on the conveyance path CP, the photo interrupter 301 is in at a light reception state in which the light emitted from the light emitting portion 302 is received by the photo sensing portion 303.

When the pressing portion 912 is pressed by the sheet conveyed by the pickup roller 908 and passing the conveyance path CP, the flag portion 914 pivots together with the pivot shaft 913 against the urging force of the torsion spring 915. Then, the light emitted from the light emitting portion 302 to the photo sensing portion 303 is blocked by the flag portion 914. That is, if a sheet exists in the conveyance path CP, the photo interrupter 301 will be in a light blocked state in which the light emitted from the light emitting portion 302 to the photo sensing portion 303 is blocked.

As described, the photo interrupter 301 outputs detection signals that differ between the light reception state and the light blocked state to the control unit 200. Then, in a state where the photo interrupter 301 is changed from the light reception state to the light blocked state, the control unit 200 detects that a tip of the sheet P has reached a position of the pressing portion 912. In a state where a trailing edge of the sheet P being conveyed passes the pressing portion 912, the flag portion 914 pivots together with the pivot shaft 913 by the urging force of the torsion spring 915, and the photo interrupter 301 shifts from the light blocked state to the light reception state. Thereby, it is detected that the trailing edge of the sheet P has passed the position of the pressing portion 912. The pickup roller 908, the flag unit 916 and a photo interrupter unit 300 described later constitute a sheet conveyance apparatus through which the sheet is conveyed.

Detailed Configuration of Photo Interrupter Unit

Figure 3A:
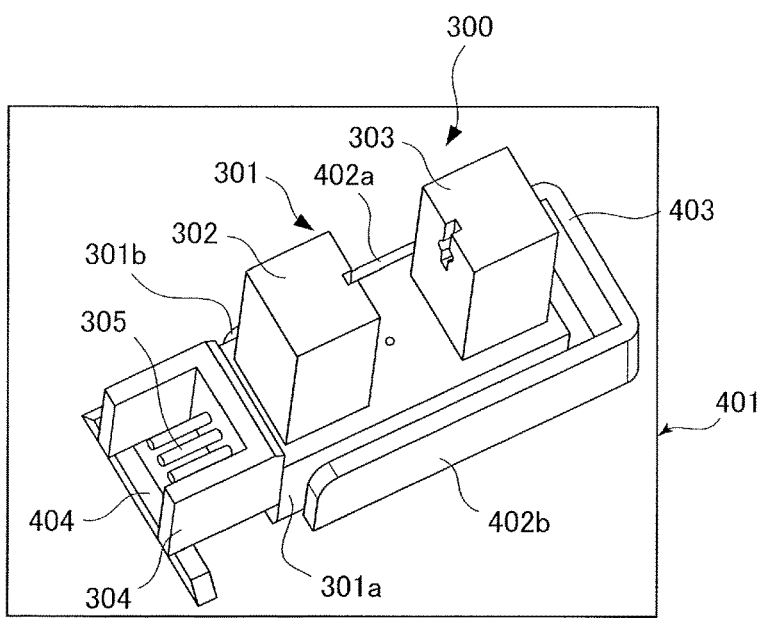
FIG. 3A is a perspective view illustrating a state in which a photo interrupter is attached to a mounting portion.
Figure 3B:
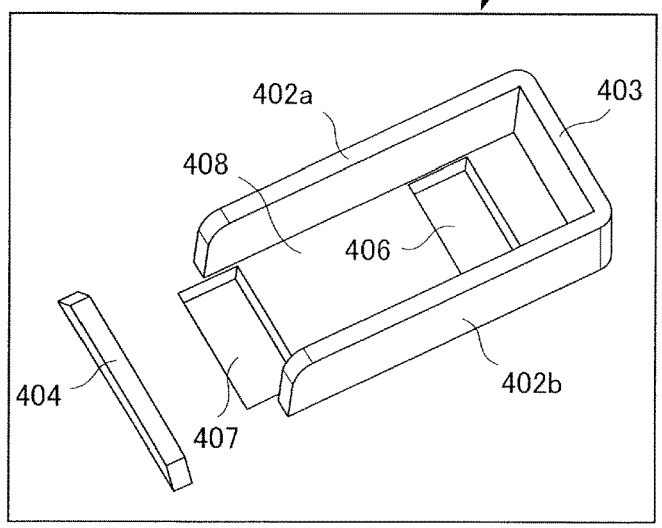
FIG. 3B is a perspective view illustrating a mounting portion in a state where the photo interrupter is removed.
Figure 3C:
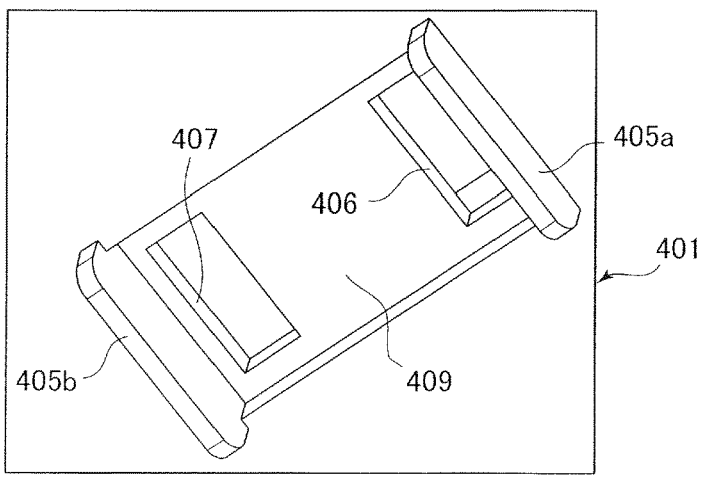
FIG. 3C is a perspective view illustrating the mounting portion from a rear surface.

FIG. 3A is a perspective view illustrating the photo interrupter unit 300 in which the photo interrupter 301 is mounted to the mounting portion 401. FIG. 3B is a perspective view in which the mounting portion 401 to which the photo interrupter 301 is mounted is viewed from a mounting surface 408 side. FIG. 3C is a perspective view in which the mounting portion 401 is viewed from a rear surface 409 side. In FIGS. 3A through 3C, a portion of the mounting portion 401 is removed.

As illustrated in FIG. 3A, a connector portion 304, electrically connected to the control unit 200 via a wiring, is provided on the photo interrupter 301, and the connector portion 304, the light emitting portion 302 and the photo sensing portion 303 are arranged in alignment in a longitudinal direction, that is, in an orthogonal direction. A plurality of connector pins 305 are arranged on an inner side of the connector portion 304. An exterior of the photo interrupter 301 including the connector portion 304, the light emitting portion 302, the photo sensing portion 303, and first and second claw portions 306 and 307 (described later) and formed of a resin having elasticity, such as a polycarbonate.

As illustrated in FIGS. 3A and 3B, the mounting portion 401 includes the mounting surface 408 to which the photo interrupter 301 is mounted. A first engagement hole portion 406, serving as an insertion hole portion, and a second engagement hole portion 407, serving as a hole portion arranged in a longitudinal direction, are formed in the mounting surface 408. The first engagement hole portion 406 forms an insertion hole through which the first claw portion 306 is inserted, and the second engagement hole portion 407 forms a hole through which the second claw portion 307 is inserted. A pair of support ribs 402a and 402b, a reverse prevention rib 403 and a connector support rib 404 are projected vertically with respect to the mounting surface 408 from the mounting surface 408. The pair of support ribs 402a and 402b, serving as a projection and a first projection, are extended along a longitudinal direction, and arranged with a clearance in a short-length direction, that is, deforming direction, orthogonal to the longitudinal direction. In a state where the photo interrupter 301 is attached to the clearance, the pair of support ribs 402a and 402b is respectively opposed to side surfaces 301a and 301b of the photo interrupter 301 with a slight gap formed therebetween.

The reverse prevention rib 403 serving as a second projection portion is formed to extend in the short-length direction so as to connect a first end portion of each of the pair of support ribs 402a and 402b. The connector support rib 404 is arranged on an opposite side from the reverse prevention rib 403 in the longitudinal direction with the first engagement hole portion 406 and the second engagement hole portion 407 interposed therebetween. The connector support rib 404 is set to a height such that a slight gap is formed with respect to the connector portion 304 in a state where the photo interrupter 301 is attached to the mounting portion 401, and supports the connector portion 304 in a state where the connector portion 304 is pressed from above and bent.

As illustrated in FIG. 3C, a pair of rear surface ribs 405a and 405b serving as opposite surface side ribs project vertically from the rear surface 409, serving as an opposite surface from the mounting surface 408 of the mounting portion 401. The first engagement hole portion 406 and the second engagement hole portion 407 are formed to pass through the mounting surface 408 to the rear surface 409 between the pair of rear surface ribs 405a and 405b.

Figure 4A:
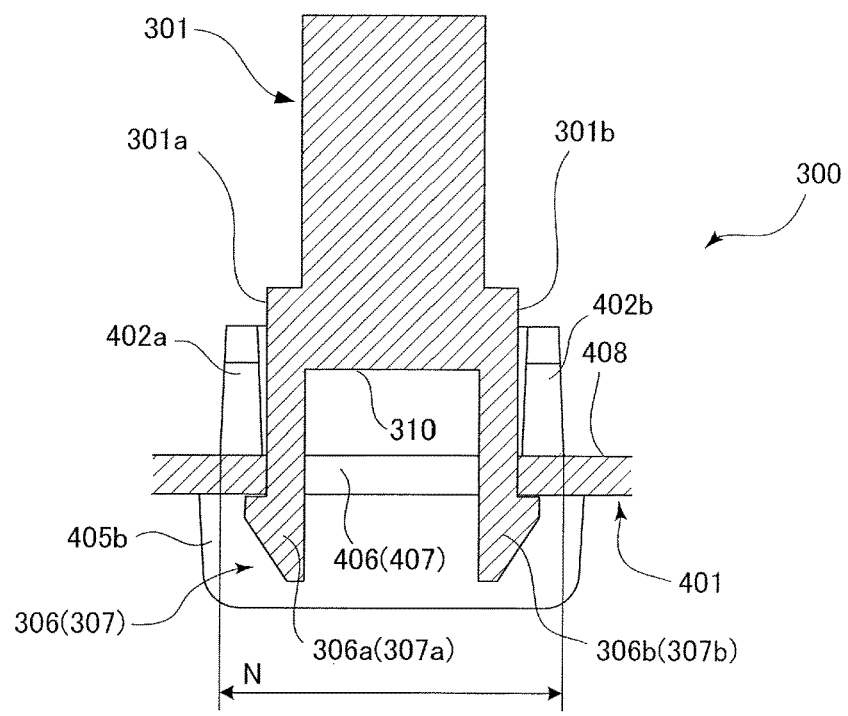
FIG. 4A is a cross-sectional view illustrating a photo interrupter unit.
Figure 4B:
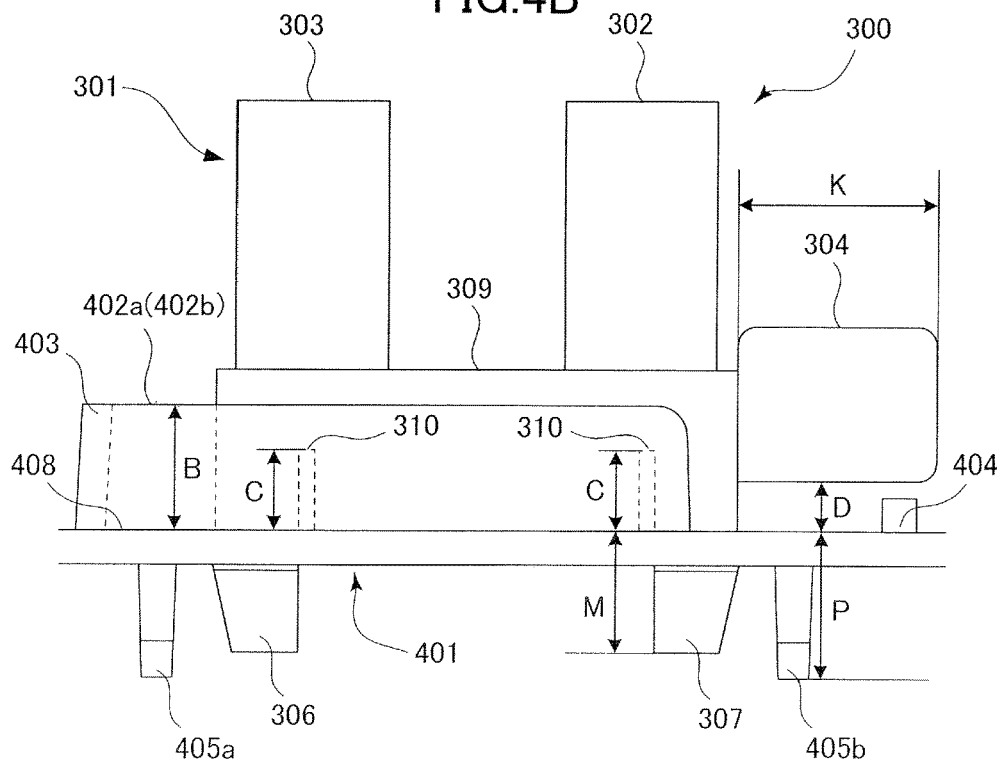
FIG. 4B is a side view illustrating a photo interrupter unit.

FIG. 4A is a cross-sectional view illustrating a state in which the photo interrupter 301 is attached to the mounting portion 401. FIG. 4B is a side view illustrating a state in which the photo interrupter 301 is attached to the mounting portion 401. As illustrated in FIGS. 4A and 4B, the photo interrupter 301 includes the first claw portion 306 serving as a leg portion and the second claw portion 307 serving as a claw portion that can be respectively engaged with the first engagement hole portion 406 and the second engagement hole portion 407. The first claw portion 306 and the second claw portion 307 have claw shaped portions formed at a tip portion thereof, and the photo interrupter 301 is attached to the mounting portion 401 by the first claw portion 306 and the second claw portion 307 being engaged with the first engagement hole portion 406 and the second engagement hole portion 407. The first claw portion 306 and the second claw portion 307 are connected to the first engagement hole portion 406 and the second engagement hole portion 407 via a so-called snap fit structure. The first claw portion 306 and the second claw portion 307 have identical shapes.

The first claw portion 306 has a pair of claws 306a and 306b, and the pair of claws 306a and 306b are formed of resin such that the claws are elastically deformable in the short-length direction, that is, in left and right direction of FIG. 4A. Similarly, the second claw portion 307 has a pair of claws 307a and 307b, and the pair of claws 307a and 307b are formed of resin such that the claws are elastically deformable in the short-length direction. The pair of claws 306a and 306b and the pair of claws 307a and 307b have tapered portions provided at an outer side in the short-length direction. In a state where the photo interrupter 301 is attached to the mounting portion 401, the tapered portions of the pair of claws 306a and 306b and the pair of claws 307a and 307b abut against the first engagement hole portion 406 and the second engagement hole portion 407 of the mounting portion 401, and the claws 306a and 306b and claws 307a and 307b are bent inward in the short-length direction. Thereafter, the pair of claws 306a and 306b and the pair of claws 307a and 307b are inserted to a depth such that the claw shapes of the tips of the pair of claws 306a and 306b and the pair of claws 307a and 307b enter the first engagement hole portion 406 and the second engagement hole portion 407. Then, the pair of claws 306a and 306b and the pair of claws 307a and 307b are restored to their original shapes, and as illustrated in FIGS. 4A and 4B, the photo interrupter 301 will be in a mounted state to the mounting portion 401.

Figure 5:
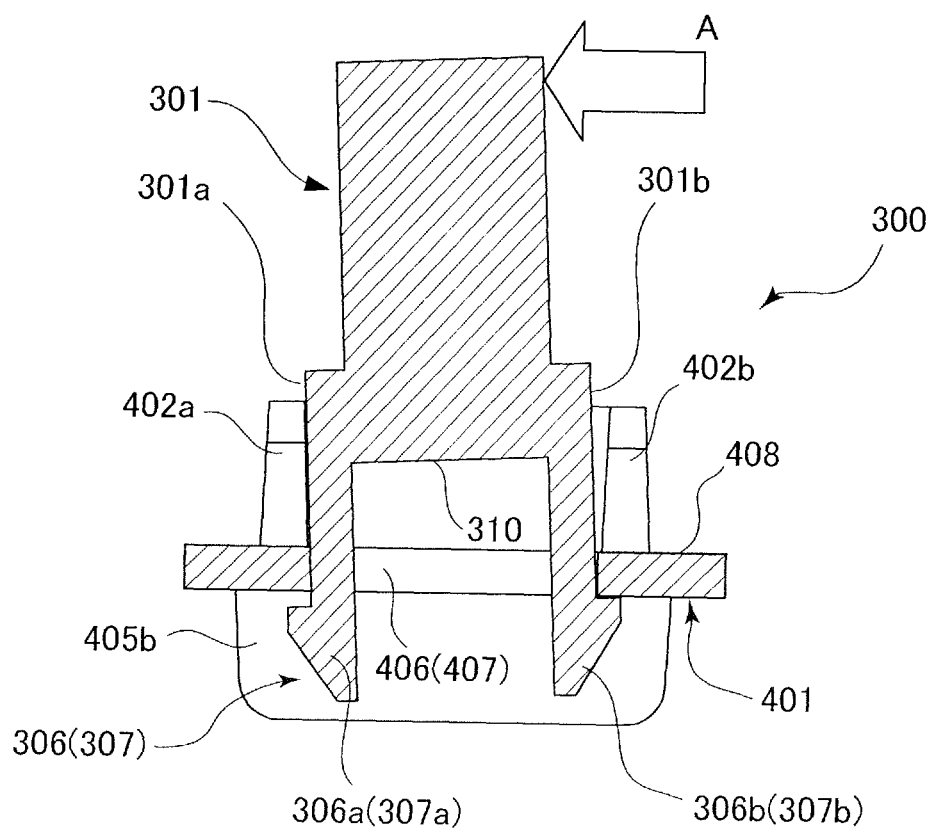
FIG. 5 is a cross-sectional view illustrating a photo interrupter in a state where external force is applied.

FIG. 5 is a cross-sectional view illustrating the photo interrupter 301 in a state where external force A is applied to a direction parallel to the mounting surface 408, that is, in the short-length direction. In a state where external force A is applied to the photo interrupter 301 attached to the mounting portion 401, as illustrated in FIG. 5, the photo interrupter 301 attempts to rotate in a direction parallel to the short-length direction. In the present embodiment, a slight gap of approximately 0.2 mm is respectively formed between the side surfaces 301a and 301b of the photo interrupter 301 and the pair of support ribs 402a and 402b, by which the mounting property of the photo interrupter 301 is improved.

For example, if external force A is applied to the photo interrupter 301 from the side surface 301b side, the gap between the side surface 301b and the support rib 402b is widened, and the side surface 301a abuts against the support rib 401a. In other words, the pair of support ribs 402a and 402b receive a part of external force A, and the position of the photo interrupter 301 in the short-length direction is regulated. Thereby, even if external force A is applied unintentionally to the photo interrupter 301, it becomes possible to prevent the state of engagement between the first and second claw portions 306 and 307 and the first and second engagement hole portions 406 and 407 from being released, and causing lock failure. The short-length direction is a direction that intersects the direction of insertion of the first and second claw portions 306 and 307 of the photo interrupter 301.

As illustrated in FIG. 4B, a height B from the mounting surface 408 to a tip of the pair of support ribs 402a and 402b is set higher than a height C from the mounting surface 408 to a base portion 310 of the first and second claw portions 306 and 307. Therefore, the pair of support ribs 402a and 402b can support the photo interrupter 301 near a top board 309 of the photo interrupter 301 where bending is relatively unlikely to occur and enabling the photo interrupter to endure greater external force. Further, since the pair of support ribs 402a and 402b is formed integrally with the mounting portion 401, there is no need to provide a separate member to prevent the photo interrupter 301 from falling and to prevent the increase in size and cost of the photo interrupter unit 300.

Mounting of Photo Interrupter Unit

Figure 6A:
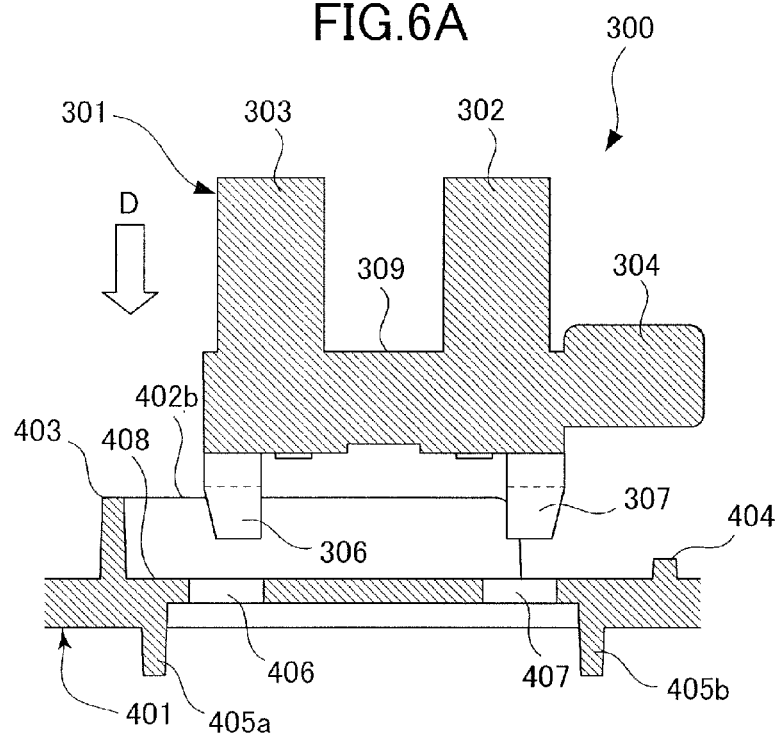
FIG. 6A is a cross-sectional view illustrating a method of mounting the photo interrupter vertically.
Figure 6B:
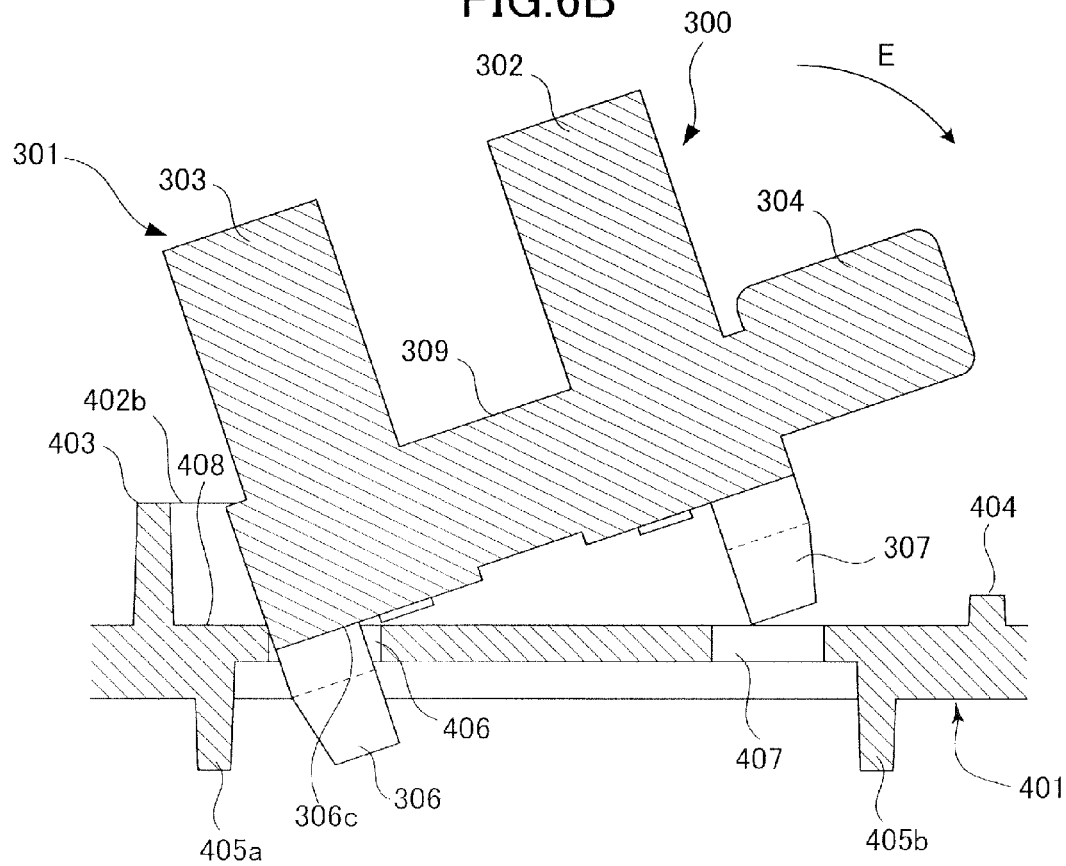
FIG. 6B is a cross-sectional view illustrating a method of mounting the photo interrupter in an inclined manner.

Next, a method for mounting the photo interrupter 301 to the mounting portion 401 will be described. FIG. 6A is a view illustrating a method for mounting the photo interrupter 301 vertically to the mounting portion 401, and FIG. 6B is a view illustrating a method for mounting the photo interrupter 301 obliquely to the mounting portion 401. Normally, as illustrated in FIG. 6A, the photo interrupter 301 is mounted to the mounting surface 408 of the mounting portion 401 from a vertical direction D vertical with respect to the mounting surface 408. That is, the first claw portion 306 and the second claw portion 307 of the photo interrupter 301 are simultaneously inserted to the first engagement hole portion 406 and the second engagement hole portion 407 of the mounting portion 401, and engagement is completed simultaneously.

Meanwhile, as illustrated in FIG. 6B, the photo interrupter 301 can be mounted to the mounting portion 401 by rotating the photo interrupter 301 in an arrow E direction in a state where the first claw portion 306 is engaged with the first engagement hole portion 406. In order to enable such mounting method, the reverse prevention rib 403 is disposed at a position where the first claw portion 306 is not abutted against the photo interrupter 301 in a state engaged with the first engagement hole portion 406. That is, the reverse prevention rib 403 is arranged such that it does not interfere with the photo interrupter 301 even if the second claw portion 307 enters the second engagement hole portion 407 in a state where the first claw portion 306 is inserted to the first engagement hole portion 406. In other words, even if the photo interrupter 301 is inclined toward the reverse prevention rib 403 in the longitudinal direction when the base portion 306c of the first claw portion 306 is inserted to the insertion hole of the first engagement hole portion 406, the reverse prevention rib 403 will not interfere with the photo interrupter 301. Thus, a mounting method similar to a photo interrupter 320 according to a second embodiment described later is enabled. Therefore, even an operator who is familiar with the mounting method of the photo interrupter 320 according to the second embodiment can mount the photo interrupter 301 according to the first embodiment without discomfort.

Figure 7:
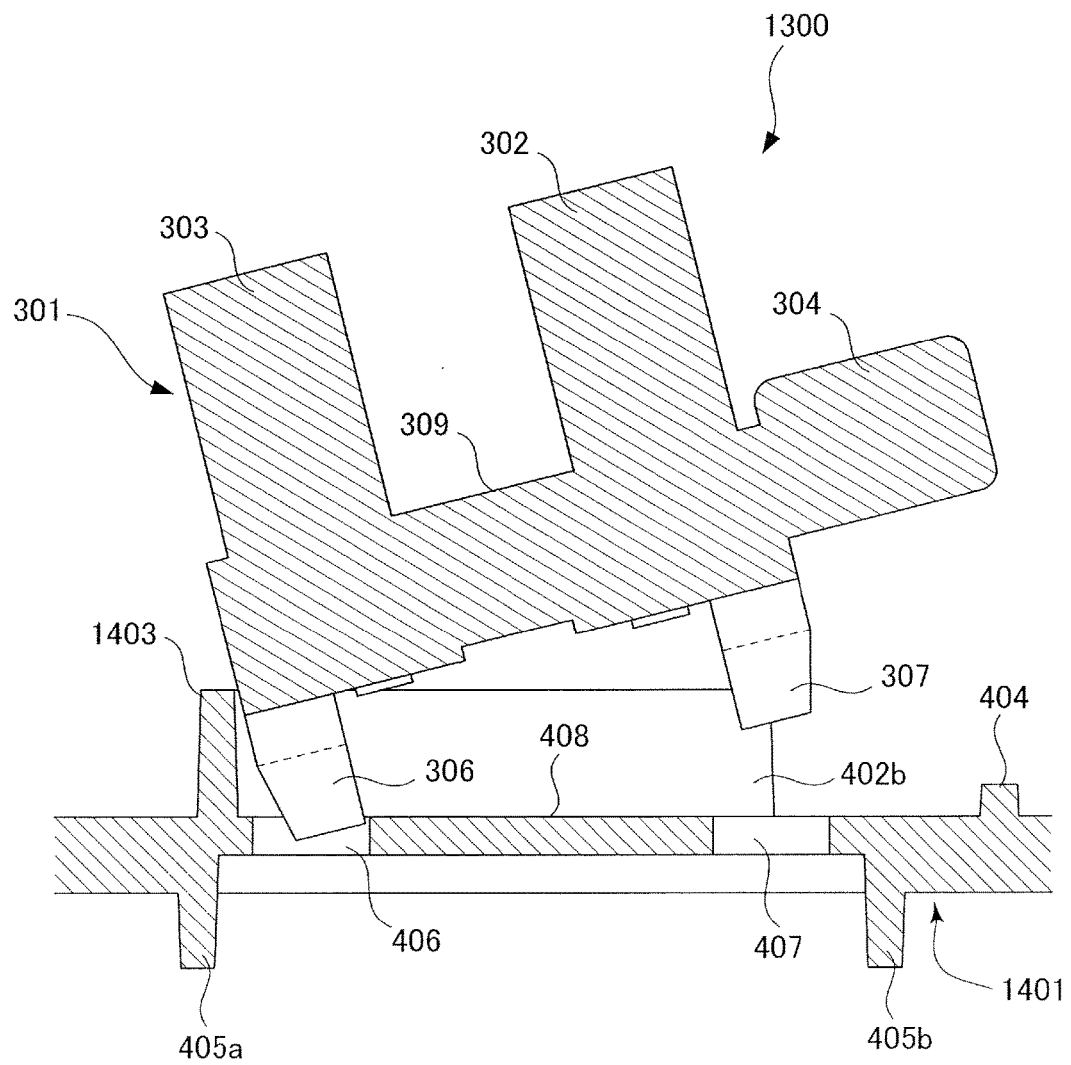
FIG. 7 is a cross-sectional view illustrating a photo interrupter unit as a comparative example.

FIG. 7 is a cross-sectional view illustrating a the photo interrupter unit 1300 as a comparative example in which the reverse prevention rib 403 of the mounting portion 401 illustrated in FIG. 6B is arranged close to the first engagement hole portion 406. As illustrated in FIG. 7, a mounting portion 1401 includes a reverse prevention rib 1403 arranged at a position close to the first engagement hole portion 406.

In this case, if the operator attempts to engage the first claw portion 306 to the first engagement hole portion 406 in a state where the second claw portion 307 is not engaged with the second engagement hole portion 407, the photo interrupter 301 and the reverse prevention rib 1403 abut against one another before the engagement of the first claw portion 306 and the first engagement hole portion 406 is completed. That is, as illustrated in FIG. 7, a state may occur in which the photo interrupter 301 abuts against the reverse prevention rib 1403 and the first claw portion 306 contacts an edge of the first engagement hole portion 406, that is, the edge of the first engagement hole portion 406 on a side facing the reverse prevention rib 1403. If the first claw portion 306 is pushed with force from above and engaged to the first engagement hole portion 406 in this state, plastic deformation of the first claw portion 306 will occur, and mounting failure is caused. If the first claw portion 306 experiences plastic deformation once, the photo interrupter 301 can no longer be mounted, such that the photo interrupter 301 having experienced plastic deformation must be discarded.

In contrast to the photo interrupter unit 1300 illustrated in FIG. 7, the photo interrupter unit 300 illustrated in FIG. 6B has the reverse prevention rib 403 arranged at a predetermined distance from the first engagement hole portion 406. Therefore, the abutment of the photo interrupter 301 and the reverse prevention rib 403 will not occur simultaneously as the abutment of the first claw portion 306 and the edge of the first engagement hole portion 406. Therefore, even if the first claw portion 306 is engaged with the first engagement hole portion 406 first, plastic deformation of the first claw portion 306 as described with reference to FIG. 7 will not occur. Therefore, according to the first embodiment illustrated in FIG. 6B, the photo interrupter 301 will not be discarded due to an erroneous mounting method, such that the mounting workability will be improved and costs can be reduced. Since there is no need to carry out a step of assembling an independent component other than the photo interrupter 301 to the mounting portion 401, the productivity can be improved.

Prevention of Reversed Mounting

Figure 8A:
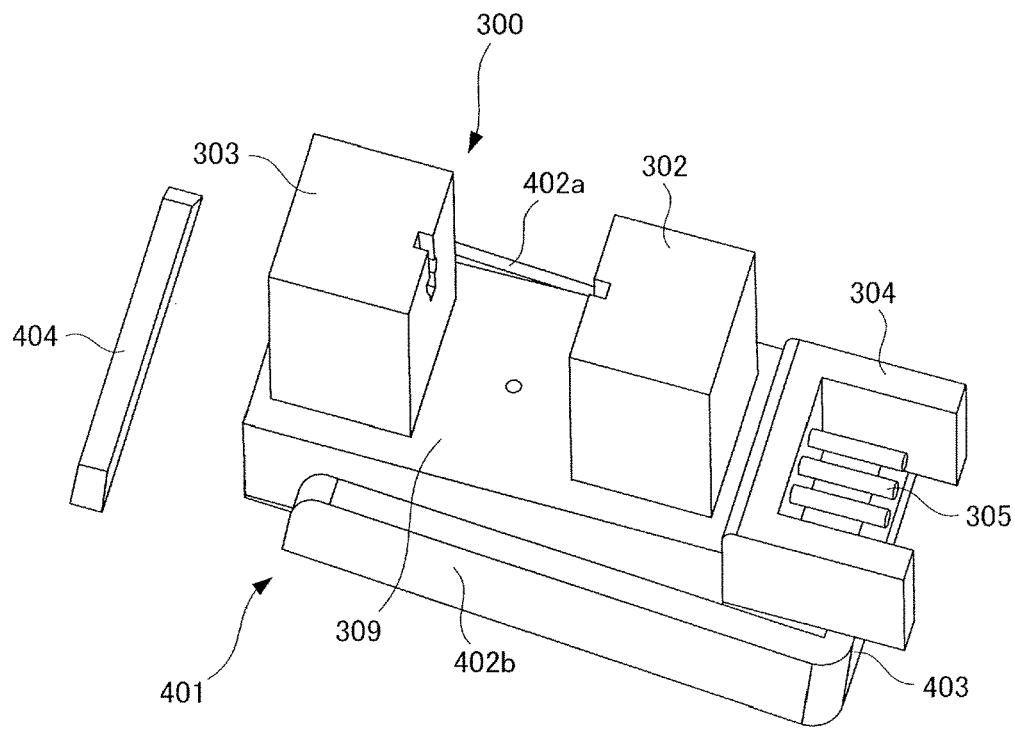
FIG. 8A is a perspective view illustrating a state in which the photo interrupter is mounted to the mounting portion in a reversed state.
Figure 8B:
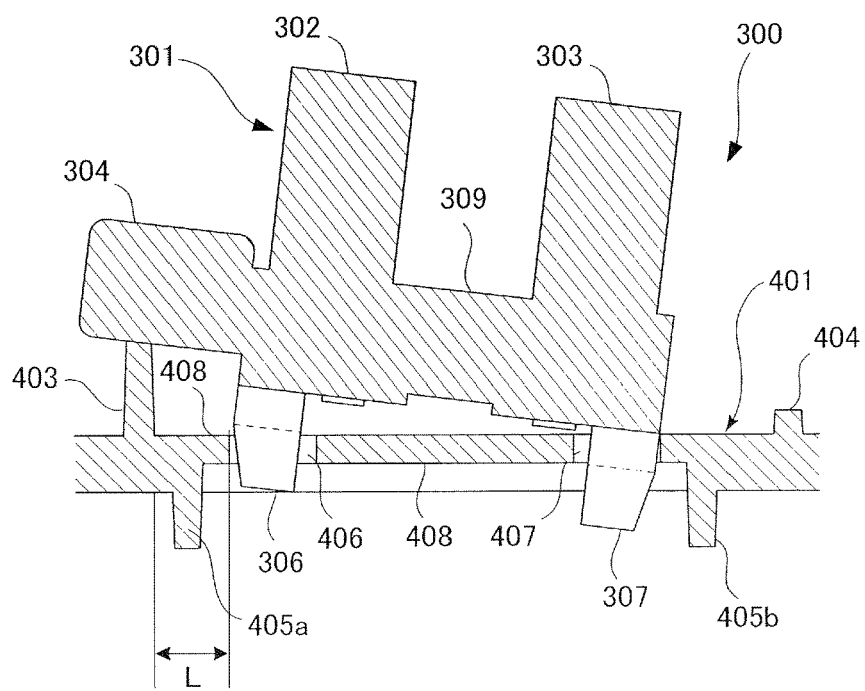
FIG. 8B is a cross-sectional view illustrating a state in which the photo interrupter is mounted to the mounting portion in a reversed state.

FIG. 8A is a perspective view illustrating a state in which the photo interrupter 301 is mounted to the mounting portion 401 in a state where the photo interrupter 301 is rotated for 180 degrees, and FIG. 8B is a cross-sectional view thereof. As illustrated in FIGS. 8A and 8B, the pair of support ribs 402a and 402b and the reverse prevention rib 403 is formed in a continuous manner and higher than a height D from the mounting surface 408 to the connector portion 304, as illustrated in FIGS. 8A and 8B. Further, a length L from the first engagement hole portion 406 to the reverse prevention rib 403 is set shorter than a length K (refer to FIG. 4B) from the second claw portion 307 to a tip of the connector portion 304. Therefore, if the photo interrupter 301 is rotated for 180 degrees from the state illustrated in FIG. 4B and attempted to be mounted to the mounting portion 401, the connector portion 304 abuts against the reverse prevention rib 403, by which the mounting of the photo interrupter 301 in the reversed state is prevented.

Figure 9A:
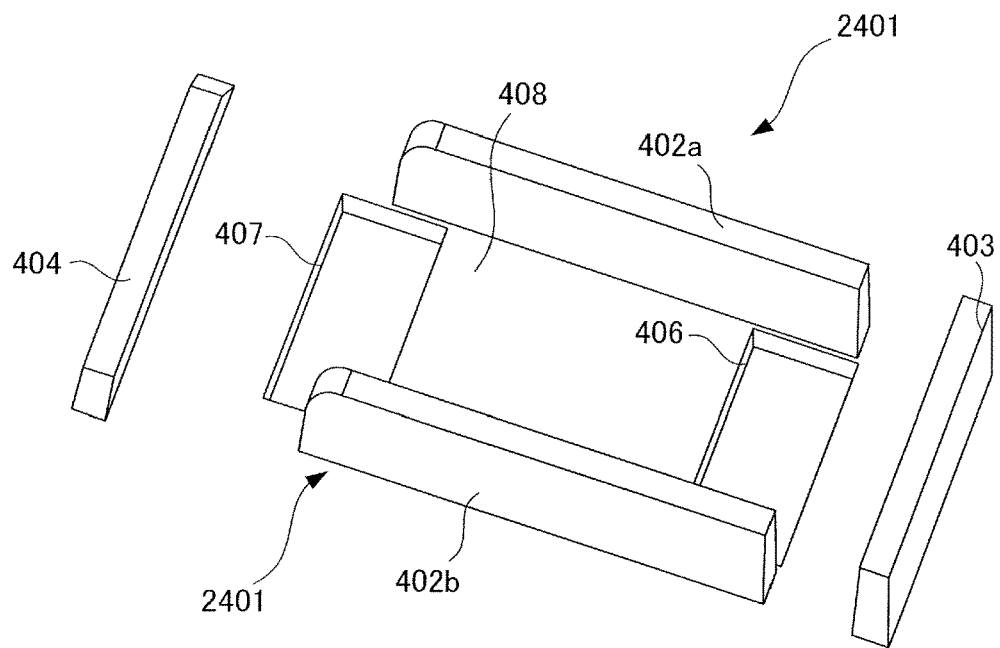
FIG. 9A is a perspective view illustrating a comparative example of a mounting portion in a state where the photo interrupter is removed.
Figure 9B:
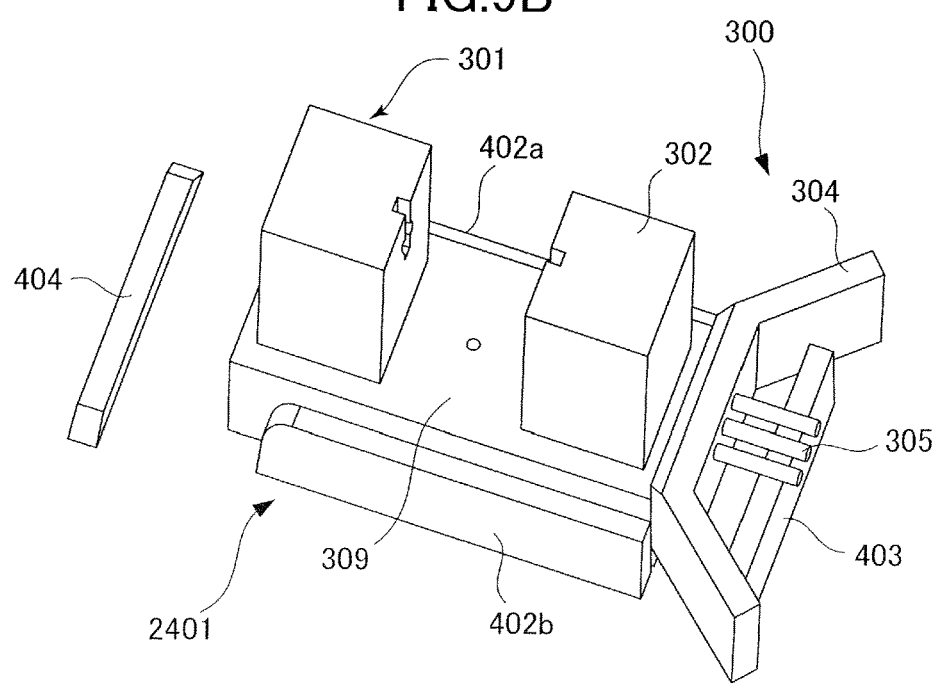
FIG. 9B is a perspective view illustrating a comparative example of a mounting portion in a state where the photo interrupter is attached.

FIG. 9A illustrates a perspective view illustrating a mounting portion 2401 as a comparative example in which the pair of the support ribs 402a and 402b and the reverse prevention rib 403 are formed in a separated manner, and FIG. 9B is a perspective view illustrating a state in which the photo interrupter 301 is mounted. If the photo interrupter 301 is attached to the mounting portion 2401 in a state where the photo interrupter 301 is reversed, the connector portion 304 abuts against the reverse prevention rib 403 as described earlier. However, if the operator does not notice the abutment and pushes the photo interrupter 301 into the mounting portion 2401 by force, the connector portion 304 may be deformed and the photo interrupter 301 may be mounted to the mounting portion 2401, as illustrated in FIG. 9B. In that case, the reverse prevention rib 403 abuts against the connector pins 305, and the connector pins 305 may be damaged.

In contrast, according to the present embodiment, the pair of support ribs 402a and 402b and the reverse prevention rib 403 are formed continuously, such that even if the connector portion 304 is bent, the photo interrupter 301 will not be mounted to the mounting portion 401 in the reversed state.

Prevention of Rear Surface Mounting

Figure 10:
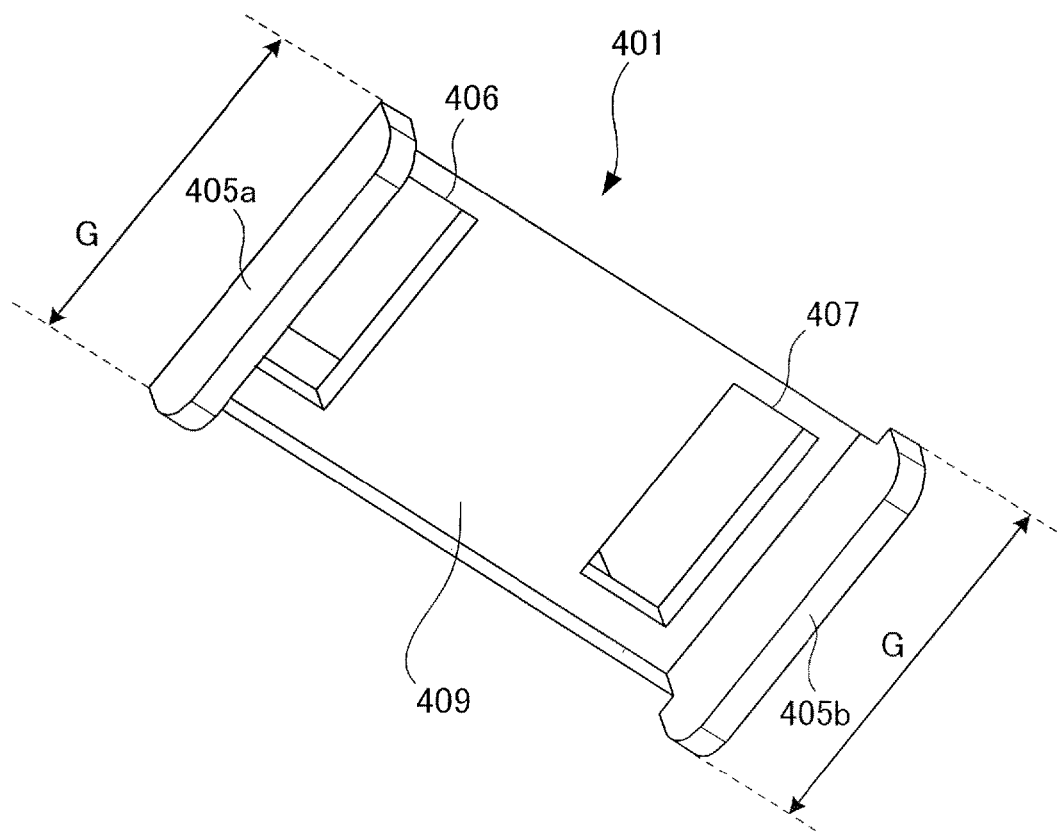
FIG. 10 is a perspective view illustrating a dimension of a rear surface rib.
Figure 11A:
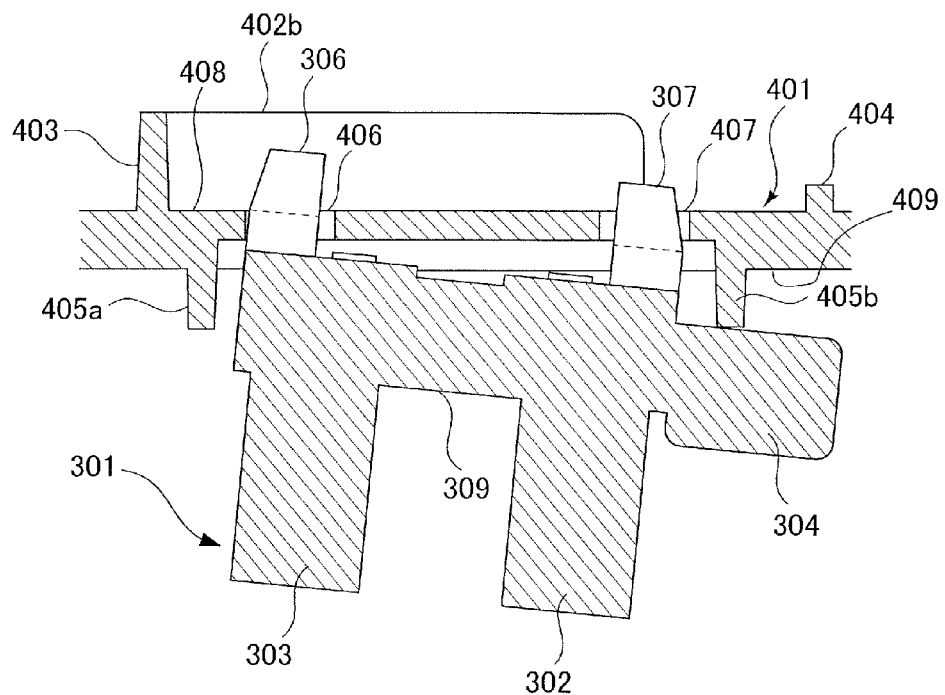
FIG. 11A is a cross-sectional view illustrating a state in which the photo interrupter is mounted from a rear surface side.
Figure 11B:
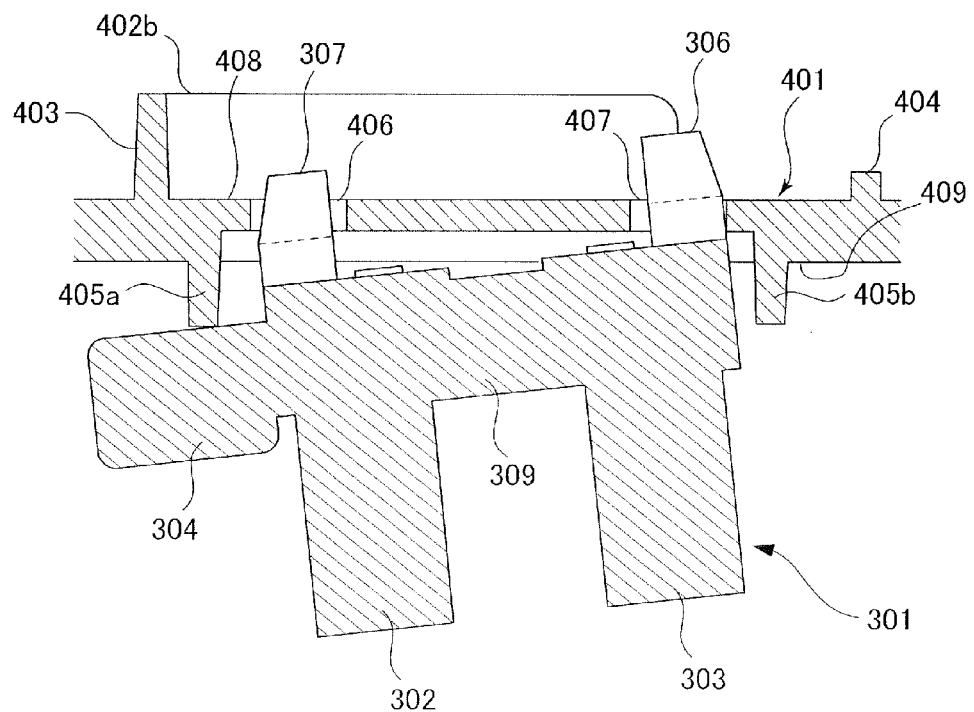
FIG. 11B is a cross-sectional view illustrating a state in which the photo interrupter in a reversed state is mounted from the rear surface side.

FIG. 10 is a perspective view illustrating the dimension of the rear surface ribs 405a and 405b. FIG. 11A is a cross-sectional view illustrating a state in which the photo interrupter 301 is mounted from the rear surface 409 side of the mounting portion 401. FIG. 11B is a cross-sectional view illustrating a state in which the photo interrupter 301 is mounted in a reversed state from the state illustrated in FIG. 11A.

A length G of the pair of rear surface ribs 405a and 405b in the short-length direction is set greater than a length N (refer to FIG. 4A) of the reverse prevention rib 403. Further, as illustrated in FIG. 4B, a height P of the rear surface ribs 405a and 405b is set even greater than the greater one of the height D from the mounting surface 408 to the connector portion 304 or a length M from the mounting surface 408 to the tip of the first and second claw portions 306 and 307.

Therefore, as illustrated in FIG. 11A, if the operator attempts to mount the photo interrupter 301 from the rear surface 409 side, the connector portion 304 will abut against a rear surface rib 405b, and the photo interrupter 301 is prevented from being mounted to the rear surface 409. In other words, the rear surface ribs 405a and 405b interfere with the photo interrupter 301 before the photo interrupter 301 is mounted to the mounting portion 401 from the rear surface 409 side. Further, as illustrated in FIG. 11B, in a state where the photo interrupter 301 in the reversed state is mounted from the rear surface 409 side, the connector portion 304 abuts against the rear surface rib 405a, and the mounting of the photo interrupter 301 on the rear surface 409 is prevented. Even if the photo interrupter 301 is pushed in with force in a state where the connector portion 304 is abutted against the rear surface ribs 405a and 405b, the length of the rear surface ribs 405a and 405b is long, as described earlier, so the photo interrupter 301 will not be attached.

Second Embodiment

Next, a second embodiment of the present invention will be described. The second embodiment adopts a configuration in which the first claw portion 306 of the photo interrupter 301 according to the first embodiment is replaced with a hook portion 321. Therefore, configurations similar to the first embodiment are either omitted from the drawing or denoted with the same reference numbers for description.

Figure 12A:
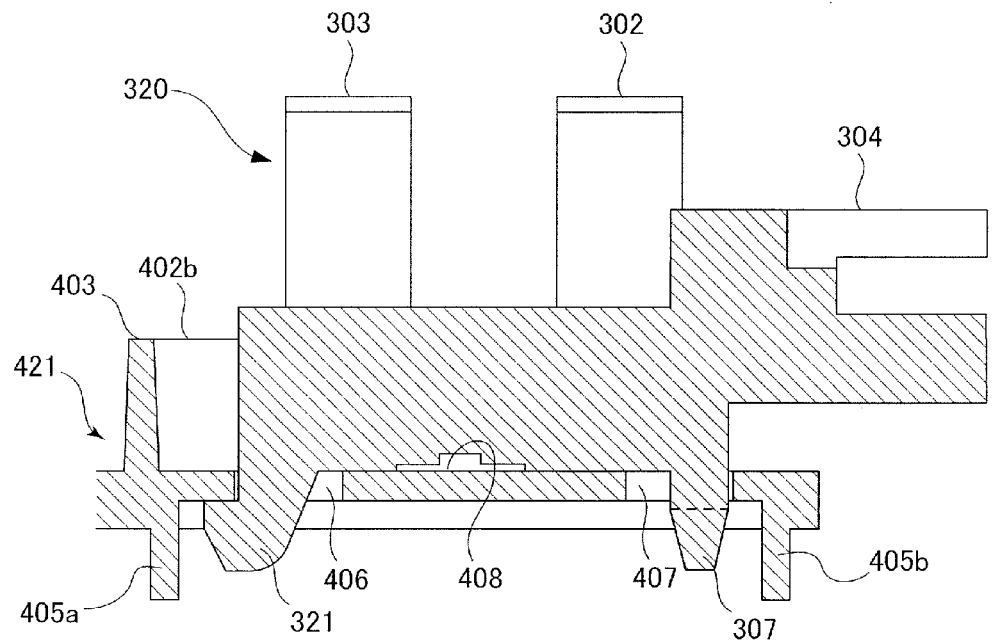
FIG. 12A is a cross-sectional view illustrating a photo interrupter and a mounting portion according to a second embodiment.
Figure 12B:
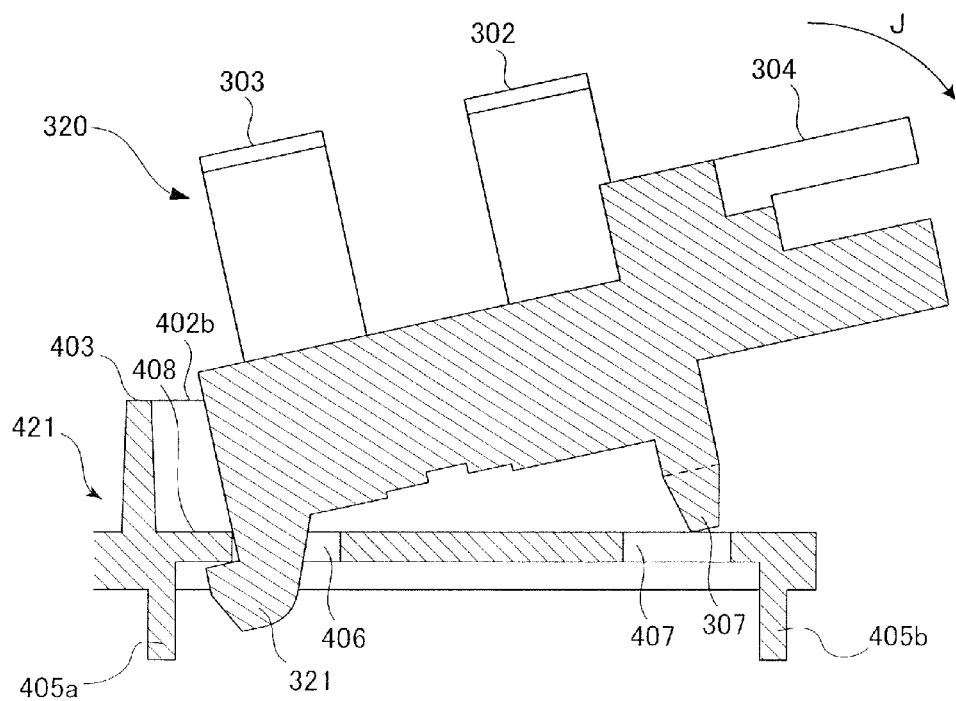
FIG. 12B is a cross-sectional view illustrating a method for mounting the photo interrupter.
Figure 13A:
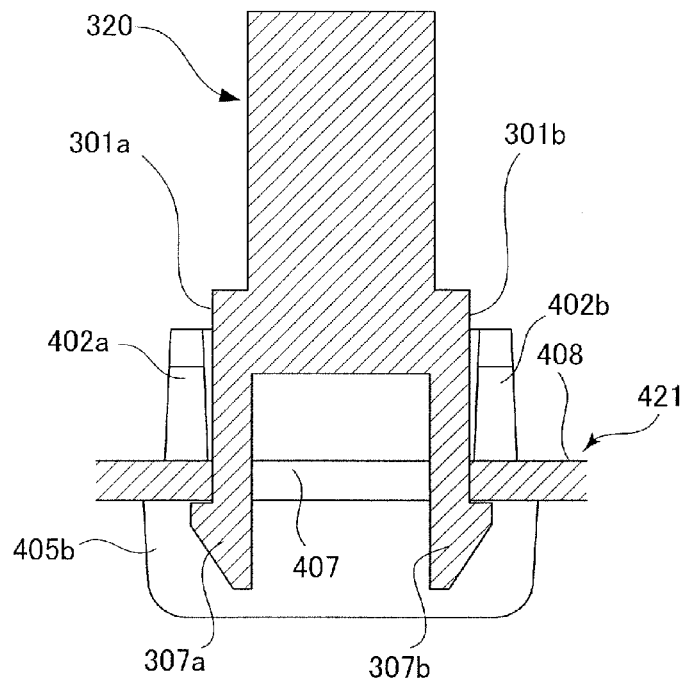
FIG. 13A is a cross-sectional view illustrating a photo interrupter and a mounting portion.
Figure 13B:
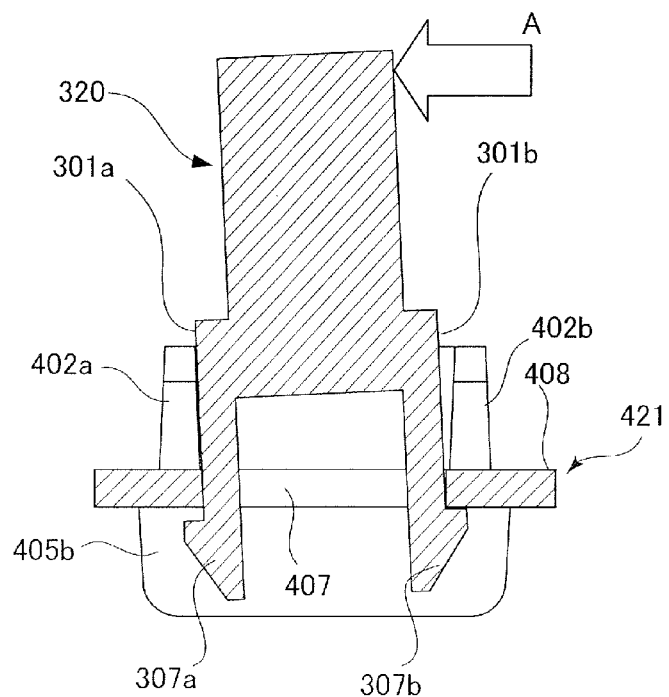
FIG. 13B is a cross-sectional view illustrating a photo interrupter in a state where external force is applied thereto.
Figures 14A, 14B:
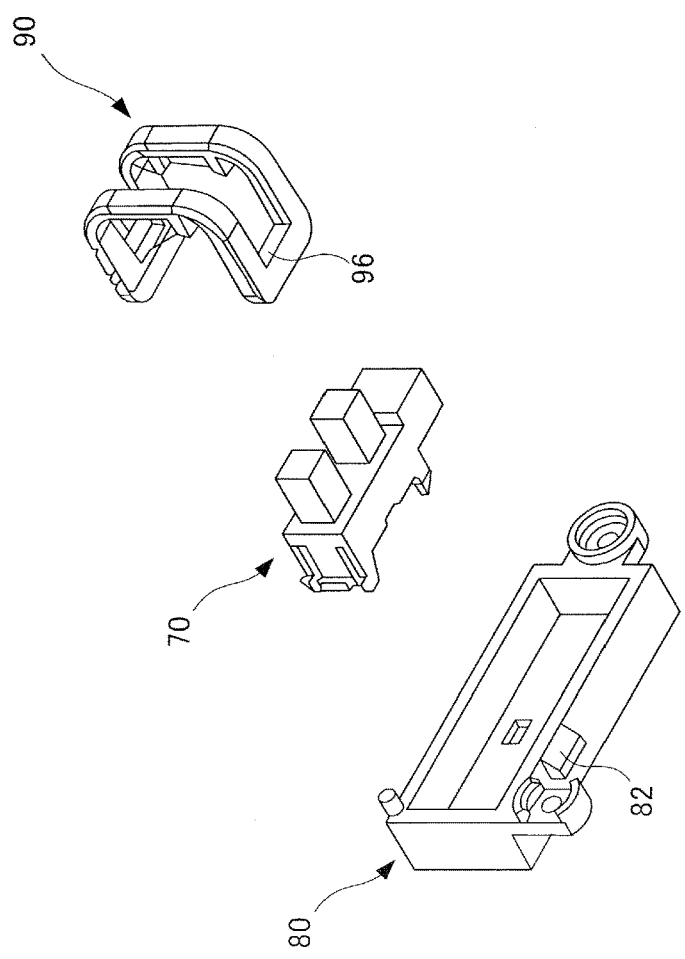
FIG. 14A is an exploded perspective view illustrating a conventional photo interrupter and fall-preventing cover.
FIG. 14B is a perspective view illustrating the conventional photo interrupter and fall-preventing cover.

FIGS. 12A and 13A are cross-sectional views illustrating a state in which the photo interrupter 320 according to the second embodiment is attached to a mounting portion 421. FIG. 12B is a cross-sectional view illustrating a method for mounting the photo interrupter 320. FIG. 13B is a cross-sectional view illustrating a state in which an external force A is applied on the photo interrupter 320.

As illustrated in FIGS. 12A and 13A, the photo interrupter 320 includes the light emitting portion 302, the photo sensing portion 303, the connector portion 304, the hook portion 321 and the second claw portion 307. The hook portion 321 serving as a leg portion is shaped like a hook in which the tip is bent in the longitudinal direction. The mounting portion 421 includes the mounting surface 408, the first engagement hole portion 406, the second engagement hole portion 407, and respective ribs described in the first embodiment.

As illustrated in FIG. 12B, when attaching the photo interrupter 320 to the mounting portion 421, the operator first engages the hook portion 321 to the first engagement hole portion 406. Thereafter, the photo interrupter 320 is rotated in the direction indicated by arrow J, while maintaining the engaged state of the hook portion 321 with the first engagement hole portion 406. Thereby, the second claw portion 307 is engaged with the second engagement hole portion 407, and the attachment of the photo interrupter 320 to the mounting portion 421 is completed.

The first engagement hole portion 406 and the second engagement hole portion 407 are designed to have a size corresponding to the photo interrupter 320, and are formed greater than the first engagement hole portion 406 and the second engagement hole portion 407 according to the first embodiment. Therefore, the photo interrupter 301 according to the first embodiment cannot be attached to the mounting portion 421 according to the second embodiment, and the photo interrupter 320 cannot be attached to the mounting portion 401.

Then, as illustrated in FIG. 13B, in a state where the external force A is applied to the photo interrupter 320 from the side surface 301b side, the gap between the side surface 301b and the support rib 402b is widened, and the side surface 301a abuts against the support rib 401a. That is, the pair of support ribs 402a and 402b receives a portion of the external force A, and the position of the photo interrupter 320 in the short-length direction is regulated. Thereby, even if external force A is applied unintentionally to the photo interrupter 320, it becomes possible to prevent the engaged state of the hook portion 321 and the second claw portion 307 and the first engagement hole portion 406 and the second engagement hole portion 407 from being released and causing lock failure.

According to the first and second embodiments described above, a gap is formed between the side surfaces 301a and 301b and the pair of support ribs 402a and 402b, but the gap can be omitted.

Further, the photo interrupter unit 300 is applicable not only to detection of sheets but also to other types of detection, such as detection of opening and closing of a door member. Further, the arrangement of the photo interrupter unit 300 is not restricted to the apparatus body 900A, and it can be arranged on the document conveyance apparatus 950A, or a finisher connected to the apparatus body 900A and configured to provide various processes to the printed sheets.

The embodiments described earlier have been illustrated based on the printer 900 adopting an electro-photographic system, but the present invention is not restricted thereto. For example, the present invention is applicable to an image forming apparatus adopting an ink-jet system in which an image is formed on a sheet by discharging liquid ink through a nozzle.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-168562, filed Aug. 30, 2016, which is hereby incorporated by reference wherein in its entirety.

What is claimed is:

1. A photo interrupter unit comprising:
   a photo interrupter including:
      a light emitting portion configured to emit light;
      a photo sensing portion configured to receive the light emitted from the light emitting portion;
      a claw portion configured to be elastically deformable; and
      a connector portion comprising a plurality of connector pins and arranged in alignment with the light emitting portion and the photo sensing portion in an alignment direction; and
   a supporting portion configured to detachably support the photo interrupter, the supporting portion including:
      a mounting surface on which the photo interrupter is mounted;
      a hole portion into which the claw portion is inserted, and which is provided in the mounting surface; and
      a projection projecting from the mounting surface and configured to regulate a position of the photo interrupter in a deforming direction in which the claw portion is elastically deformable in a state where the claw portion is inserted into the hole portion,
   wherein the projection is arranged not to oppose the plurality of the connector pins in the alignment direction.

2. The photo interrupter unit according to claim 1, wherein the photo interrupter further includes a base portion, the claw portion extending from the base portion, and
   a height from the mounting surface to a tip of the projection is higher than a height from the mounting surface to the base portion in a state where the photo interrupter is attached to the supporting portion.

3. The photo interrupter unit according to claim 1, wherein the projection is a first projection,
   the supporting portion comprises a second projection arranged on an opposite side from the connector portion in the alignment direction orthogonal to the deforming direction, the light emitting portion and the photo sensing portion being interposed between the connector portion and the second projection in a state where the photo interrupter is attached to the supporting portion, the second projection projecting from the mounting surface, and
   a height of the second projection from the mounting surface is higher than a height from the mounting surface to the connector portion in a state where the photo interrupter is attached to the supporting portion.

4. The photo interrupter unit according to claim 3, wherein the photo interrupter comprises a leg portion arranged more distant from the connector portion than the claw portion in the alignment direction,
   the supporting portion comprises an insertion hole portion through which the leg portion is inserted and which is provided in the mounting surface, and
   the second projection is arranged distant from the insertion hole portion such that in a state where the leg portion is inserted as deep as a base portion of the leg portion to the insertion hole portion, even if the photo interrupter is tilted toward the second projection in the alignment direction, the second projection does not interfere with the photo interrupter.

5. The photo interrupter unit according to claim 4, wherein the leg portion comprises a claw configured to be elastically deformable in the deforming direction.

6. The photo interrupter unit according to claim 4, wherein a length from the insertion hole portion to the second projection in the alignment direction is shorter than a length from the claw portion to the tip of the connector portion in the alignment direction.

7. The photo interrupter unit according to claim 3, wherein the first projection comprises a pair of ribs opposed to each other in the deforming direction.

8. The photo interrupter unit according to claim 7, wherein the second projection extends in the deforming direction and connects the pair of ribs, and
   the pair of ribs and the second projection is formed continuously in a U-shape.

9. The photo interrupter unit according to claim 1, wherein the supporting portion comprises an opposite surface side rib projected from an opposite surface on an opposite side from the mounting surface of the supporting portion, and if the photo interrupter is being attached to the supporting portion from the opposite surface, the opposite surface side rib interferes with the photo interrupter and regulates attachment of the photo interrupter.

10. The photo interrupter unit according to claim 9, wherein the opposite surface side rib is arranged in alignment with the hole portion in the alignment direction orthogonal to the deforming direction.

11. The photo interrupter unit according to claim 1, wherein the deforming direction is a direction orthogonal to a direction of insertion of the claw portion.

12. The photo interrupter unit according to claim 1, wherein the projection is arranged to regulate the position of the photo interrupter by contacting with a side surface, in the deforming direction, of the photo interrupter.

13. A sheet conveyance apparatus comprising:
  a photo interrupter unit including:
    a light emitting portion configured to emit light;
    a photo sensing portion configured to receive the light emitted from the light emitting portion;
    a claw portion configured to be elastically deformable; and
    a connector portion comprising a plurality of connector pins and arranged in alignment with the light emitting portion and the photo sensing portion in an alignment direction; and
  a supporting portion configured to detachably support the photo interrupter, the supporting portion including:
    a mounting surface on which the photo interrupter is mounted;
    a hole portion into which the claw portion is inserted, and which is provided in the mounting surface; and
    a projection projecting from the mounting surface and configured to regulate a position of the photo interrupter in a deforming direction in which the claw portion is elastically deformable in a state where the claw portion is inserted into the hole portion; and
  a conveyance portion configured to convey a sheet;
  a moving portion configured to move by being pressed by the sheet conveyed from the conveyance portion and configured to block light emitted from the light emitting portion to the photo sensing portion
  wherein the projection is arranged not to oppose the plurality of the connector pins in the alignment direction, and
  wherein the photo interrupter unit is configured to output a detection signal in accordance with a light reception state of light emitted from the light emitting portion in the photo sensing portion.

14. The sheet conveyance apparatus according to claim 13, further comprising an image forming portion configured to form an image on the sheet.

* * * * *